United States Patent
Goodwin et al.

(10) Patent No.: US 7,291,569 B2
(45) Date of Patent: Nov. 6, 2007

(54) FLUIDS FOR IMMERSION LITHOGRAPHY SYSTEMS

(75) Inventors: Francis Goodwin, Halfmoon, NY (US); Stefan Brandl, Albany, NY (US); Brian Martinick, Ballston Lake, NY (US)

(73) Assignee: Infineon Technologies AG, Munich (DE)

( * ) Notice: Subject to any disclaimer, the term of this patent is extended or adjusted under 35 U.S.C. 154(b) by 149 days.

(21) Appl. No.: 11/170,200

(22) Filed: Jun. 29, 2005

(65) Prior Publication Data
US 2007/0004234 A1     Jan. 4, 2007

(51) Int. Cl.
*H01L 21/00* (2006.01)
(52) U.S. Cl. ......................................... 438/800; 355/53
(58) Field of Classification Search ................ 438/800; 355/53, 67, 72, 77
See application file for complete search history.

(56) References Cited

U.S. PATENT DOCUMENTS 7,170,583 B2 * 1/2007 Van Der Meulen et al. .. 355/53

2005/0048220 A1 * 3/2005 Mertens et al. ............. 427/553
2005/0048813 A1    3/2005 Streefkerk et al.

FOREIGN PATENT DOCUMENTS

| EP | 1 522 894 A2 | 4/2005 |
| WO | WO 2005/050324 A2 | 6/2005 |
| WO | WO 2005/062351 A1 | 7/2005 |

OTHER PUBLICATIONS

"Technology Backgrounder: Immersion Lithography," downloaded Apr. 20, 2005, pp. 1-5, IC Knowledge, http://www.icknowledge.com/misc_technology/immersion%20Lithography.pdf.

* cited by examiner

*Primary Examiner*—Phuc T. Dang
(74) *Attorney, Agent, or Firm*—Slater & Matsil, L.L.P.

(57) ABSTRACT

Fluids for use in immersion lithography systems are disclosed. A resistivity-altering substance is introduced into a fluid, making it more conductive. The fluid is then disposed between an immersion head of a projection lens system and a semiconductor wafer during an exposure process. Because the fluid is conductive, electrostatic energy that may develop during the movement of the semiconductor wafer with respect to the projection lens system during the exposure process is discharged through the conductive fluid, preventing damage to an immersion head of the projection lens system, the semiconductor wafer, and sensors of a stage that supports the semiconductor wafer.

23 Claims, 4 Drawing Sheets

FLUIDS FOR IMMERSION LITHOGRAPHY SYSTEMS

TECHNICAL FIELD

The present invention relates generally to lithography systems for manufacturing semiconductor devices, and more particularly to fluids for use in immersion lithography systems and immersion exposure tools.

BACKGROUND

Semiconductor devices are manufactured by depositing many different types of material layers over a semiconductor workpiece or wafer. The material layers are patterned using lithography. The material layers typically comprise thin films of conductive, semiconductive, and insulating materials that are patterned and etched to form integrated circuits (IC's).

For many years in the semiconductor industry, optical lithography techniques such as contact printing, proximity printing, and projection printing have been used to pattern material layers of integrated circuits. Projection printing is commonly used in the semiconductor industry using wavelengths of 248 nm or 193 nm, as examples. At such wavelengths, lens projection systems and transmission lithography masks are used for patterning, wherein light is passed through the lithography mask to impinge upon a wafer.

However, as the minimum feature sizes of IC's are decreased, the semiconductor industry is exploring the use of alternatives to traditional optical lithography techniques, in order to meet the demand for decreased feature sizes in the industry. For example, short wavelength lithography techniques, Scattering with Angular Limitation in Projection Electron-beam Lithography (SCALPEL), other non-optical lithographic techniques, and immersion lithography are under development as replacements for traditional optical lithography techniques.

In immersion lithography, the gap between the last lens element in the optics system and a semiconductor wafer is filled with a liquid, such as water, to enhance system performance. The presence of the liquid enables the index of refraction in the imaging plane, and therefore the numerical aperture of the projection system, to be greater than unity. Thus, immersion lithography has the potential to extend exposure tool minimum feature sizes down to about 45 nm or less, for example.

FIG. 1 shows a perspective view of a prior art immersion lithography system or immersion exposure tool 100. An immersion exposure tool 100 such as the one shown in FIG. 1 is described in more detail in "Technology Backgrounder: Immersion Lithography," from the website: http://www.ic-knowledge.com/misc_technology/Immersion %20Lithography.pdf, which is incorporated herein by reference. Immersion exposure tools are described in further detail in U.S. patent application No. 2005/0046813 A1, published on Mar. 3, 2005, for example, which is also incorporated herein by reference.

The immersion exposure tool 100 shown in FIG. 1 includes a wafer support 104 adapted to support a wafer 102. The wafer support 104 is also referred to as a wafer stage or exposure chuck, for example. A projection lens system 108 is disposed proximate the wafer 102. A fluid 106 that typically comprises de-ionized water is introduced between a last element or lens 110 of the projection lens system 108 and the wafer 102 during the exposure process, e.g., by an immersion head 120 clamped to the end of the lens system 108 or to another part of the immersion exposure tool 100. The immersion head 120 is also referred to in the art as a shower head, for example.

The wafer support 104 and the wafer 102 are moved during the patterning of the individual die or regions of die 112 on the wafer 102, e.g., from one side to another, and thus the immersion exposure tool 100 is also referred to in the art as an immersion lithography scanner. The projection lens system 108 is typically quite large and therefore usually remains stationary, for example. The wafer support 104 typically has recessed areas formed therein so that the wafer 102 is recessed when placed on the wafer support 104, as shown. One or more sensors 105 may be coupled to the wafer support 104, and may be embedded in the wafer support 104, for example, as shown. The sensors 105 are typically used for metrology, e.g., for alignment purposes, and/or illumination intensity, dose control, and laser energy measurement, although the sensors 105 may alternatively be used for other measurements. The sensors 105 may comprise an array of sensors, and may be coated with a layer of titanium nitride or other material, for example.

The fluid 106 is typically provided by a nozzle or by input and output ports within the immersion head 120, for example. During an exposure process, the fluid 106 generally continuously flows, to provide temperature stability for the immersion head and other components of the immersion exposure tool 100. In some immersion exposure tools 100, when the lens system 108 is not being used to expose the wafer 102, a closing disk 118 is used to close the end of the immersion head 120. The closing disk 118 may be disposed on the same wafer support 104 that supports the wafer 102, or the closing disk 118 may be located elsewhere in the immersion exposure tool 100 (not shown), for example.

The immersion exposure tool 100 also includes a fluid handler 114 adapted to provide the fluid 106. The fluid handler 114 may comprise a cabinet having components such as a fluid supply 116 and temperature controller, as examples, although the fluid handler 114 may also include other components, not shown. The fluid handler 114 may be coupled to the immersion head 120 by a hose 117 or other fluid-delivering means.

The wafer 102 typically includes a workpiece with a layer of radiation sensitive material such as photoresist disposed thereon. The pattern from a mask or reticle (not shown) is imaged onto the photoresist using a beam of radiation or light emitted from the lens system 108. The beam is emitted from an energy source, not shown, such as a light source, and the beam is passed through the lens system 108 to the photoresist of the wafer 102. After exposure of the photoresist, the patterned photoresist is later used as a mask while portions of a material layer (not shown) disposed over the wafer 102 are etched away (also not shown).

FIG. 2 shows a more detailed cross-sectional view of a portion 124 of the prior art immersion exposure tool 100 shown in FIG. 1 proximate the interface of the immersion head 120 and the wafer 102. The fluid 106 makes contact with a portion of the top surface of the wafer 102 and the bottom surface of the last element 110 of the projection lens system 108. The immersion head 120 includes ports 122 that may comprise an annular ring of ports for supplying the fluid 106 between the wafer 102 and the immersion head 120. The ports 122 may comprise input and output ports for injecting and removing the fluid 106, for example.

A problem with prior art immersion lithography systems 100 is that as the wafer 102 is moved beneath the last lens element 110 and immersion head 120 during the exposure process, an electrostatic charge builds up. The electrostatic charge discharges, e.g., at 126, which can damage the wafer and/or immersion head. The electrostatic charge 126 may also damage the sensors 105 or a coating on the sensors 105, for example. Such electrostatic discharge 126 causes uncertainty in the lithography process, decreases semiconductor device yields, and may require costly repairs or replacement of portions of the immersion lithography equipment, such as the sensors 105 and the immersion head 120.

Thus, what are needed in the art are methods of preventing damage from electrostatic discharge in immersion lithography systems.

SUMMARY OF THE INVENTION

These and other problems are generally solved or circumvented, and technical advantages are generally achieved, by preferred embodiments of the present invention, which comprise novel conductive fluids for use in immersion lithography systems. The fluids prevent damage to a semiconductor workpiece and to portions of the immersion lithography system from electrostatic discharge.

In accordance with a preferred embodiment of the present invention, a fluid for an immersion lithography system includes a first component and a second component. The second component comprises a substance that alters the resistivity of the first component.

In accordance with another preferred embodiment of the present invention, a method of forming a fluid for an immersion lithography system includes providing a first component, and introducing a second component to the first component. The second component comprises a substance that alters the resistivity of the first component.

In accordance with yet another preferred embodiment of the present invention, an immersion lithography system includes a stage, the stage being adapted to support a semiconductor workpiece, and a projection lens system disposed proximate the stage, the projection lens system having a last element disposed at one end thereof. An immersion head is disposed proximate the last element of the projection lens system, the immersion head comprising a plurality of ports for disposing a fluid between the last element of the projection lens system and the stage. The immersion lithography system includes a fluid handler adapted to provide the fluid, wherein the fluid is electrically conductive.

In accordance with another preferred embodiment of the present invention, an immersion lithography system includes a stage, the stage being adapted to support a semiconductor workpiece, and a projection lens system disposed proximate the stage, the projection lens system having a last element disposed at one end thereof. An immersion head is disposed proximate the last element of the projection lens system, the immersion head comprising a plurality of ports for disposing a fluid between the last element of the projection lens system and the stage. The immersion lithography system includes a means for altering a resistivity of the fluid.

In accordance with yet another preferred embodiment of the present invention, a method of lithography for semiconductor devices includes providing an immersion exposure tool having a wafer support, a projection lens system, an immersion head adapted to dispose a fluid between the projection lens system and the wafer support, and an energy source proximate the projection lens system. A workpiece is provided having a radiation sensitive material disposed thereon. The workpiece is positioned on the wafer support, and the fluid is disposed between the workpiece and the lens system, the fluid being conductive. The radiation sensitive material of the workpiece is exposed to radiation from the energy source.

Advantages of preferred embodiments of the present invention include providing novel conductive liquids for use in immersion lithography exposure tools and systems. Damage from electrostatic discharge to a semiconductor workpiece and also to the immersion head of the immersion lithography system is prevented, resulting in increased device yields and avoiding costly lithography equipment repair and replacement.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 2:
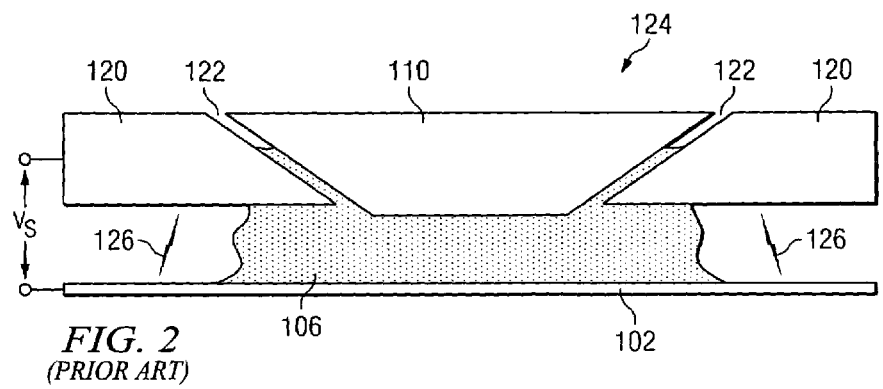
FIG. 2 is a more detailed cross-sectional view of a portion of the prior art immersion exposure tool shown in FIG. 1, wherein electrostatic discharge may damage the immersion head or the semiconductor wafer.

Referring again to the portion 124 of the prior art immersion exposure tool 100 shown in FIG. 2, the fluid 106 used for immersion lithography typically comprises distilled de-ionized water, which is an insulator. During the movement of the scanner (e.g., the stage 104 that supports the workpiece 102), an electrostatic charge $V_S$ or energy potential builds up between the workpiece 102 and the immersion head 120. The last lens element 110 typically comprises a material such as fused quartz that will not hold a charge, for example.

Figure 1:
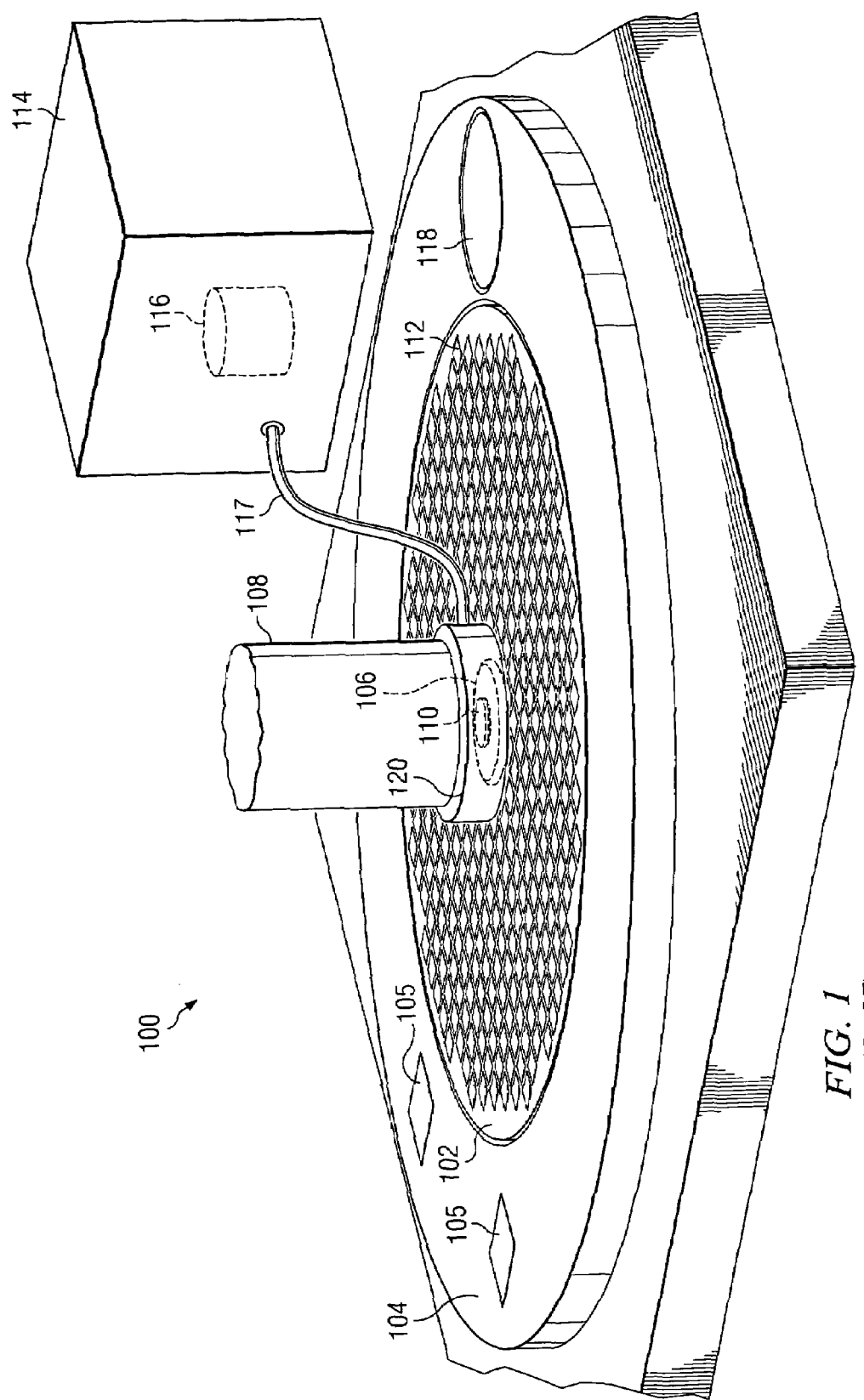
FIG. 1 is a perspective view of a prior art immersion exposure tool, wherein a fluid is disposed between a lens system and a semiconductor wafer during the lithography process.

In particular, as an example, a capacitance having a voltage $V_S$ is created between the immersion head 120 and the workpiece 102 due to the movement of the stage 104 (see FIG. 1), e.g., by friction between the air and the workpiece 102. The resistance of the fluid 106 is greater than the resistance of the air, and may comprise about 13 MΩ, for example. After the breakdown voltage (e.g., of the air) between the workpiece 102 and the immersion head 120 has been reached, electric current arcs from the immersion head 120 to the workpiece 102. The electrostatic charge $V_S$ does not discharge through the insulating fluid 106, but rather, arcs or discharges directly to the workpiece 102, as shown at 126.

Because prior art fluids 106 used in immersion lithography are insulative, the resistance of the fluid 106 is greater than the air or gas between the workpiece 102 and the immersion head 120. The air in the lithography tool 100 may comprise air with an optional mixture of $N_2$ or other gases added, for example. Therefore, rather than discharging through the fluid 106, any electrostatic charge built up during the movement of the workpiece 102 with respect to the immersion head 120 will discharge across the air between the workpiece 102 and the immersion head 120, e.g., in the area under the immersion head 120 surrounding the fluid 106.

The direct electrostatic discharge 126 can cause damage to both the workpiece 102 and the immersion head 120. The discharge 126 can cause burning or exposure of the photoresist disposed on the workpiece 102, resulting in defects being printed on the workpiece 102, for example, and resulting in decreased device yields. The discharge 126 may also damage the immersion head 120, requiring that the immersion head 120 be repaired or replaced, which is time-consuming and costly.

Embodiments of the present invention achieve technical advantages by controlling the electrostatic discharge from the immersion head of an immersion lithography scanner to the workpiece, thereby preventing damage to workpiece and the immersion head itself. By lowering the resistivity of the immersion fluid, the fluid becomes more conductive, thus allowing discharge through the fluid. Advantageously, direct arcing between the immersion head and the substrate is prevented by the novel embodiments of the present invention.

In accordance with a preferred embodiment of the present invention, a novel conductive fluid for use in immersion lithography systems and tools is disclosed herein. Embodiments of the present invention also include methods of creating the fluid, and immersion lithography systems and tools that utilize the fluid. Embodiments of the present invention also include fluid handlers adapted to create and provide the fluid, and methods of patterning semiconductor devices using an immersion lithography system implementing the fluid. These embodiments will next be described.

Figure 3:
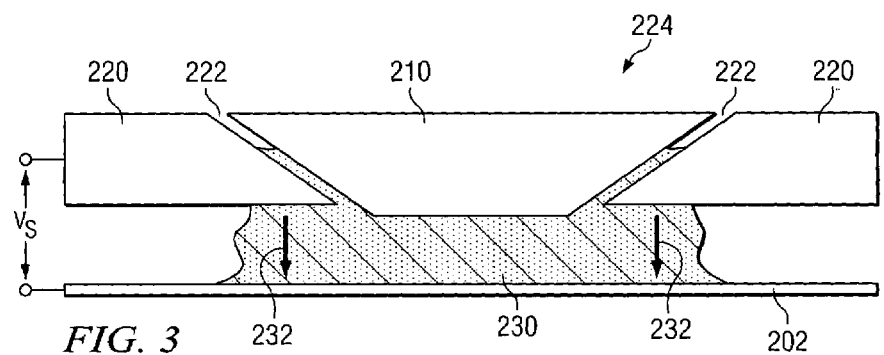
FIG. 3 shows a cross-sectional view of a portion of an immersion exposure tool, wherein the novel conductive fluid of embodiments of the present invention discharges electrostatic build-up.
Figure 4:
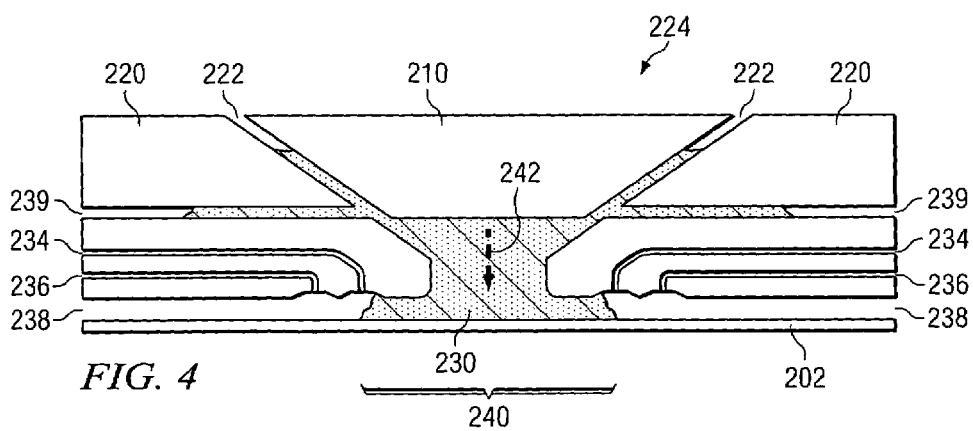
FIG. 4 shows a more detailed view of the view shown in FIG. 3, including the fluid, vacuum, and air ports.

FIG. 3 shows a cross-sectional view 224 of a portion of an immersion exposure tool, wherein the novel conductive fluid 230 of embodiments of the present invention discharges electrostatic build-up $V_S$ on a continual basis, e.g., during movement of the workpiece 202 with respect to the immersion head 220, such as during an exposure process. FIG. 4 shows a more detailed view of the view shown in FIG. 3, including fluid, vacuum, and air ports of the immersion head 220. For example, the immersion head may include an annular ring of input and output ports 239 for introducing the fluid 230 and removing the fluid 230. The ports 239 may also be referred to as fluid flow ports 239, for example.

The immersion head 220 may include an annular ring of vacuum ports 234 disposed at a bottom surface of the immersion head 220, as shown. The vacuum ports 234 may function to ensure that the fluid 230 is disposed immediately beneath the last lens element 210 during an exposure process, yet away from undesired portions of the workpiece 202 and other areas of the immersion lithography tool, for example.

The immersion head 220 may also include an annular ring of pressurized air ports 236 disposed proximate the vacuum portions 234. The pressurized air ports 236 are also referred to in the art as an air knife or an air bearing, for example. The pressurized air ports 236 are adapted to maintain a predetermined amount of space or distance 238 between the immersion head 220 and the workpiece 202. The pressurized air ports 236 are adapted to blow high velocity air downward towards the workpiece 202 and also may contribute to the build-up of electrostatic charge $V_S$, for example.

The immersion head 220 may also include vacuum ports 222 adapted to maintain and control the level of the fluid 230, as shown.

The workpiece 202 may include a semiconductor substrate comprising silicon or other semiconductor materials, for example. The workpiece 202 may also include active components or circuits formed thereon, not shown. The workpiece 202 may comprise silicon oxide over single-crystal silicon, for example. The workpiece 202 may comprise a silicon-on-insulator (SOI) substrate, as another example. The workpiece 202 may include conductive layers or other semiconductor elements, e.g. transistors, diodes, etc. Compound semiconductors, GaAs, InP, Si/Ge, or SiC, as examples, may be used in place of silicon. The workpiece 202 preferably comprises a material layer or layers to be patterned formed thereon, and a radiation or energy sensitive material such as a photoresist disposed over the material layer or layers to be patterned, not shown.

To pattern the material layer of the workpiece 202, energy 242 such as light is directed from the last lens element 210 through the fluid 230 and towards the layer of radiation sensitive material disposed on the workpiece 202, e.g., in the region 240 of the workpiece 202 disposed immediately beneath the last lens element 210. The energy 242 has preferably been passed through a lithography mask (not shown) comprising the desired pattern for the material layer or layers to be patterned on the workpiece 202, for example. The layer of radiation sensitive material is then exposed, and the layer of radiation sensitive material is used as a mask while the material layer or layers of the workpiece 202 to be patterned are etched away, for example.

Figure 5:
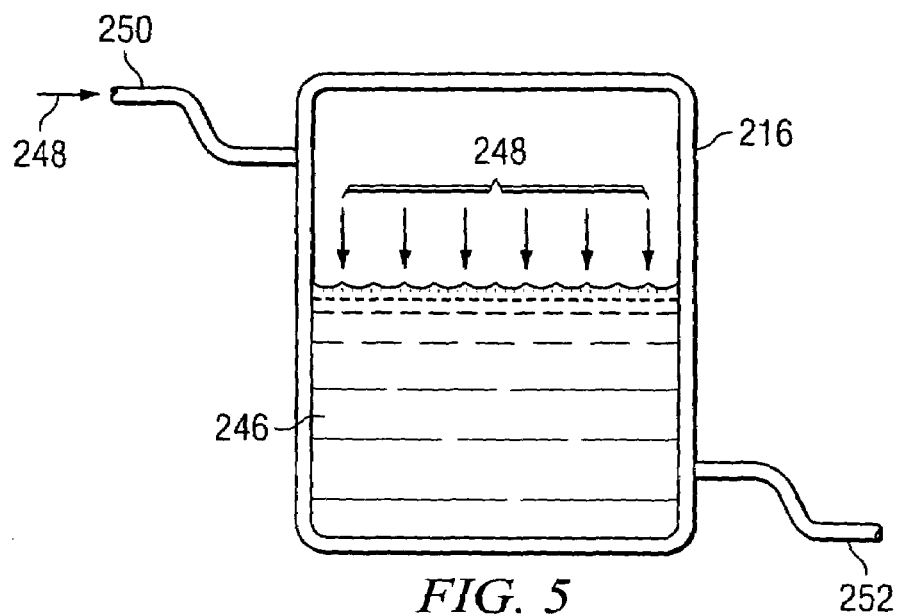
FIGS. 5 and 6 show block diagrams of a method of introducing a resistance-reducing substance to a fluid in accordance with an embodiment of the present invention, to create the conductive fluid.
Figure 6:
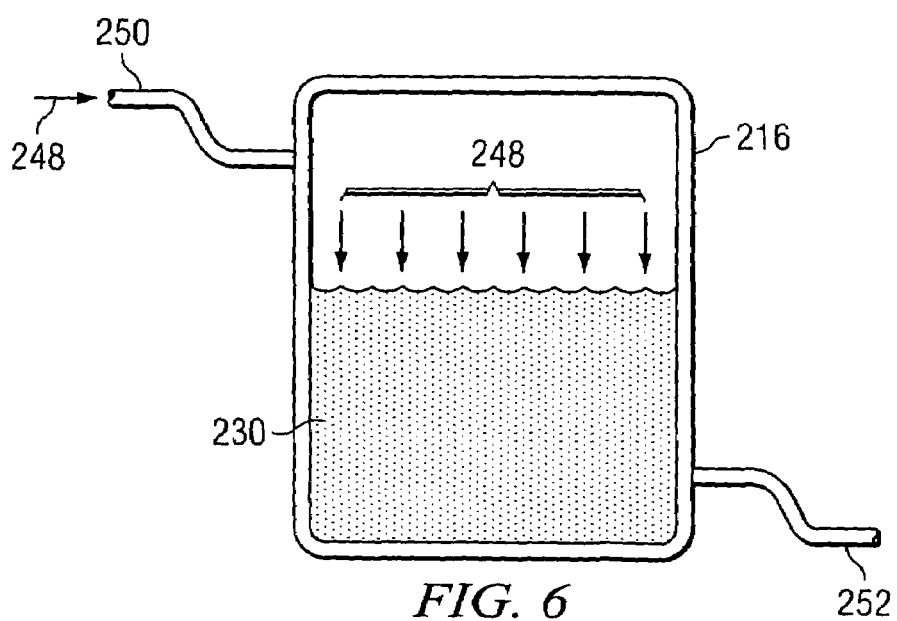

FIGS. 5 and 6 show block diagrams of a method of forming the novel fluid 230 of embodiments of the present invention. A fluid handler 216 is provided. The fluid handler 216 may comprise the fluid handler or a portion of a fluid handler of an immersion lithography system or tool, for example. In one embodiment, the fluid handler 216 preferably comprises a chamber adapted to hold a fluid. The fluid handler 216 includes at least one input port 250 and at least one output port 252, for example, as shown.

A first component 246 is placed in the chamber 216, as shown in FIG. 5. The first component 246 preferably comprises a fluid, and more preferably comprises water, in one embodiment. The first component 246 may comprise water, distilled water, de-ionized water, or distilled de-ionized water, as examples, although alternatively, the first component 246 may comprise other materials. The first component 246 is preferably substantially insulative, e.g., the first component 246 may have a resistivity that is greater than the resistivity of the ambient air of an immersion lithography tool 260 such as the one shown in FIG. 7, for example.

Referring again to FIG. 5, next, a second component 248 is introduced into the chamber 216, in particular, to the first component 246, e.g., through the input port 250. The second component 248 preferably comprises a substance that alters the resistivity of the first component 246. The second component 248 preferably comprises a gas, for example, in some embodiments. The second component 248 preferably comprises carbon dioxide ($CO_2$) in one embodiment, although the second component 248 may alternatively comprise other substances, such as $O_2$, $N_2$, a nitrogen-containing substance, an oxygen-containing substance, or other gases, as examples. Alternatively, other substances such as liquids or solids may be used for the second component 248, for example. Preferably, the second component 248 does not comprise a substance that could be damaging to the photo-sensitive material deposited on the workpiece 202 or any other element in the immersion lithography tool, for example.

In one embodiment, the second component 248 preferably comprises a liquid. The second component 248 may comprise $H_2O_2$, as an example, although alternatively, the second component 248 may comprise other liquids.

In another embodiment, the second component 248 preferably comprises a solid. The second component 248 may comprise a salt such as NaCl, as an example, although alternatively, the second component 248 may comprise other salts or other solids. The second component 248 preferably comprises a low concentration within the first component 246 in this embodiment, for example.

The second component 248 preferably is dissolved into the first component 246. In one embodiment, the second component 248 preferably comprises a substance that does not precipitate out of the first component 246. The concentration of the second component 248 is preferably selected so that the second component 248 will not precipitate out of the first component 246, for example. Preferably, the fluid 230 is optically transparent, to ensure that the energy or light 242 (see FIG. 4) is transmitted accurately and completely through the fluid 230, for example.

The second component 248 preferably comprises a substance that decreases the resistivity of the first component 246, thus making the combined fluid 230 (see FIG. 6) comprising the first component 246 and the second component 248 more electrically conductive than the first component 246 alone.

Thus, in accordance with an embodiment of the present invention, the resistivity of the first component 246, which may comprise water, is preferably lowered by dissolving a resistivity lowering substance (e.g., the second component 248) such as carbon dioxide (or a liquid, solid, or other gas) into the first component 246. In one embodiment, for example, the fluid 230 comprises carbon dioxide enriched water, having an increased conductivity compared to the conductivity of the first component 246 of the fluid 230. The fluid 230 may comprise ($H_2O+CO_2$), ($H_2O+N_2$), or ($H_2O+O_2$), as examples.

Lowering the resistivity advantageously increases the conductivity of the fluid 230 (e.g., the first component 246 and second component 248 solution). Advantageously, when the fluid 230 is used in an immersion lithography tool 260 (see FIG. 7), any static charge $V_S$ build-up that develops will continuously and slowly discharge through the novel fluid 230 that provides a path for the current, so that a dielectric breakdown between the immersion head 220 and the workpiece 202 (see FIG. 3) is prevented. Decreasing the resistivity if the immersion fluid 230 prevents electrostatic charge build up by allowing current to flow between the immersion head 220 and the workpiece 202 through the novel fluid 230. Thus, the fluid 230 having decreased resistivity provides electrostatic discharge control for the immersion head 220.

In one embodiment, the chamber 216 is preferably pressurized while introducing the second component 248 to the first component 246, for example. However, an excessive amount of the second component 248 is preferably not introduced into the first component 246, to avoid the formation of bubbles (e.g., in the case where the second component 248 comprises a gas) that would interfere with the integrity of the pattern transfer in the lithography process, for example. As an example, preferably the first component 246 is not saturated, or near saturation, with the second component 248.

The fluid 230 in one embodiment comprises a solution of the first component 246 and the second component 248. The fluid may comprise the first component 246 enriched with the second component 248, or may comprise the second component 248 dissolved in the first component 246, for example.

Figure 7:
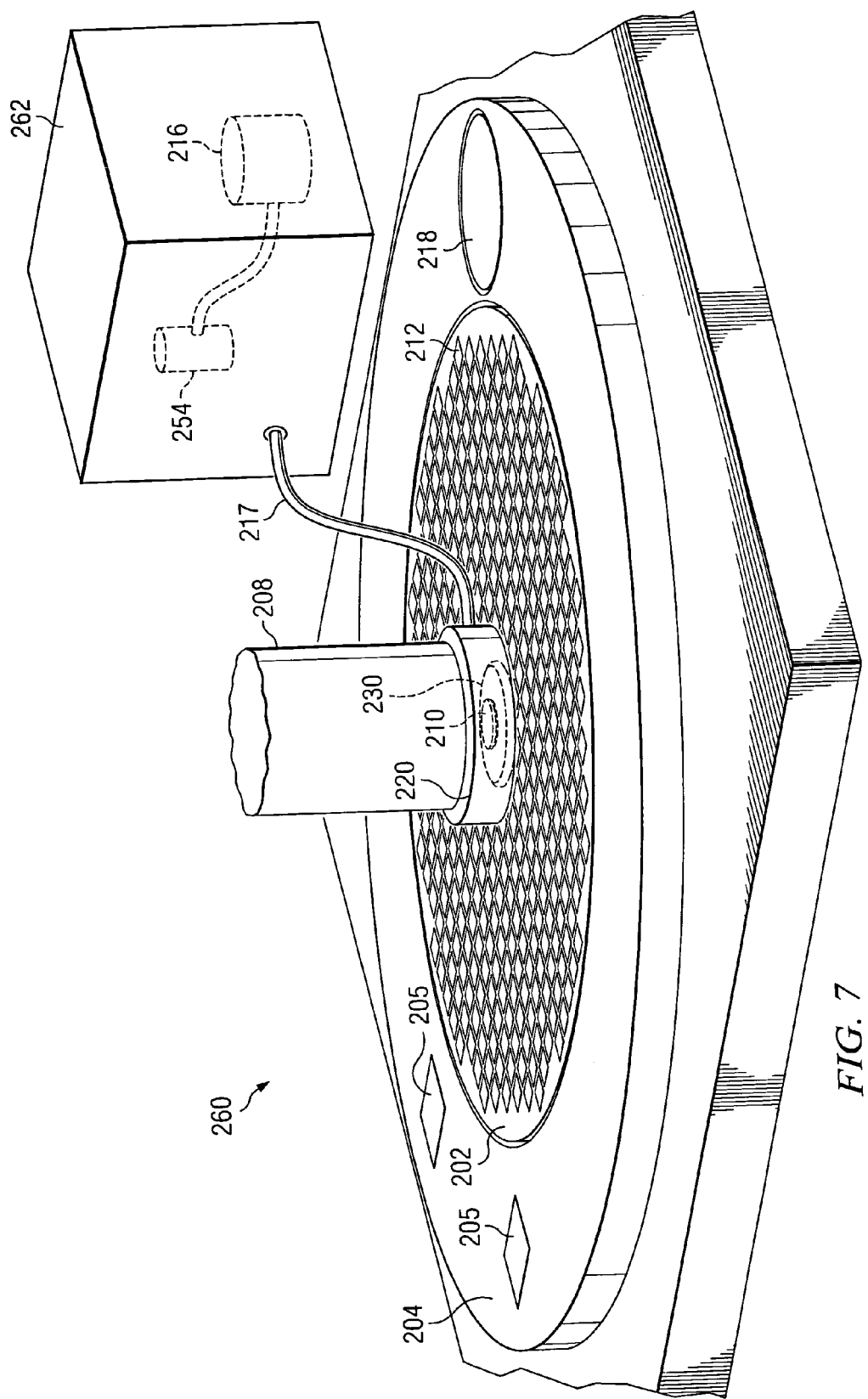
FIG. 7 shows a perspective view of an immersion exposure tool in accordance with an embodiment of the present invention, wherein the novel conductive fluid described herein is disposed between the lens system and a semiconductor wafer during the lithography process.

Embodiments of the present invention also include immersion lithography systems and tools 260 including the fluid 230, as shown in a perspective view in FIG. 7. Advantageously, the novel conductive fluid 230 described herein is disposed between the optical lens system 208 and a semiconductor wafer or workpiece 202 during the lithography process. The system 260 includes a stage 204, the stage 204 being adapted to support a semiconductor workpiece 202. The stage 204 may include one or more sensors 205 embedded therein that may comprise metrology sensors, alignment sensors, illumination intensity sensors, and dose control sensors, as examples. A projection lens system 208 is disposed proximate the stage 204, the projection lens system 208 having a last element 210 disposed at one end thereof. An immersion head 220 is disposed proximate the last element 210 of the projection lens system 208, the immersion head 220 comprising a plurality of ports (such as ports 222, 234, 236 and/or 239; see FIG. 4) for disposing and controlling the fluid 230 between the last element 210 of the projection lens system 208 and a workpiece 202 positioned on the stage 204. The immersion lithography system 260 preferably includes a means for altering a resistivity of a fluid such as the first component 246 shown in FIG. 5. For example, in one embodiment, the immersion lithography system 260 includes a fluid handler 262 adapted to provide the novel fluid 230 described herein, as shown in FIG. 7.

One embodiment of the present invention includes a fluid handler 262 for an immersion lithography system 260. The fluid handler 262 is adapted to provide the fluid 230 described herein. The fluid handler 262 comprises a chamber 216 and a means for providing the first component 246 and the second component 248. The fluid handler 262 may be coupled to the immersion head 220 by a hose 217 or other fluid-delivering means, as shown in FIG. 7.

The fluid handler 260 preferably comprises a unit 254 adapted to provide the resistivity altering substance (e.g., the second component 248) of the fluid 230, for example. If the second component 248 comprises a gas, for example, the unit 254 may comprise a chamber 254 that is coupled to the chamber 216, for example. The unit 254 may comprise a reservoir for containing the resistivity altering substance 248, for example. The unit 254 for providing the second component 248 may comprise premix chamber, e.g., if the second component 248 comprises a solid. The premix chamber is adapted to mix the second component 248 with the first component 246, or to contain or provide a premixed solution of the first component 246 and the second component 248, for example. The unit 254 may also comprise an injection system, e.g., if the second component 248 comprises a liquid. The injection system is adapted to inject the second component 248 into the first component. The second component 248 may be introduced by injecting the second component 248 into the first component 246, for example. However, alternatively, the unit 254 may comprise other means for providing or introducing the second component 248, or combinations of two or more means for providing or introducing the second component 248, as examples.

Preferably, in accordance with embodiments of the present invention, the second component 248 preferably comprises a concentration within the first component 246 that will prevent or stop precipitation out of the first component 246. If the second component 248 comprises a liquid or a solid, the second component 248 is preferably premixed or injected at concentrations sufficient to prevent or stop precipitation of the second component 248 out of the first component 246, for example.

In one embodiment, a method of lithography for semiconductor device includes providing an immersion exposure tool 260 (see FIG. 7) having a wafer support 204, a projection lens system 208, an immersion head 220 adapted to dispose the fluid 230 between the projection lens system 208 and the wafer support 204, and an energy source (not shown) proximate the projection lens system 208. A workpiece 202 having a radiation sensitive material disposed thereon is provided. The workpiece 202 is positioned on the wafer support 204, and the fluid 230 is disposed between the workpiece 202 and the lens system 208. The radiation sensitive material of the workpiece 202 is then exposed to radiation from the energy source, patterning the radiation sensitive material. The radiation sensitive material is then used to pattern a material layer or layers of the workpiece 202.

Advantages of preferred embodiments of the present invention include controlling electrostatic discharge that can build up on various components of immersion lithography tools. Damage to the workpiece 202 and the immersion head 220 is avoided. Because the electrostatic build-up is continuously discharged from the immersion head 220 through the fluid 230 to the workpiece 202, large, sudden, and unpredictable surges of voltage discharge are prevented. Advantageously, the fluid 230 remains transparent and thus the integrity of the pattern transfer is not degraded. The novel fluid 230 also controls electrostatic discharge when a closing disk 218 (see FIG. 7) is attached to the immersion head 220, for example. The novel fluid 230 advantageously decreases the current density and magnitude of the discharge of electrostatic charge build-up between the immersion head 220 and the workpiece 202 or between the immersion head 220 and sensors 205 embedded in the wafer stage 204, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of lithography for semiconductor devices, the method comprising:
    providing an immersion exposure tool having a wafer support, a projection lens system, an immersion head adapted to dispose a fluid between the projection lens system and the wafer support, and an energy source proximate the projection lens system;
    providing a workpiece having a radiation sensitive material disposed thereon;
    positioning the workpiece on the wafer support;
    disposing the fluid between the workpiece and the lens system, the fluid comprising a first component and a second component, wherein the first component comprises a conductive fluid, and wherein addition of the second component to the first component alters the resistivity of the fluid;
    exposing the radiation sensitive material of the workpiece to radiation from the energy source; and
    using the radiation sensitive material as a mask to pattern the workpiece.

2. The method according to claim 1, wherein the second component comprises a gas.

3. The method according to claim 1, wherein using the radiation sensitive material as a mask comprises etching a material layer or layers of the workpiece.

4. The method according to claim 1, wherein the workpiece comprises a semiconductor wafer.

5. The method according to claim 1, wherein the first component comprises water, distilled water, de-ionized water, or distilled de-ionized water.

6. The method according to claim 2, wherein the second component comprises $CO_2$, $O_2$, or $N_2$.

7. The method according to claim 1, wherein the second component comprises a nitrogen-containing substance, or an oxygen-containing substance.

8. The method according to claim 1, wherein the second component comprises a liquid or a solid.

9. The method according to claim 8, wherein the second component comprises $H_2O_2$ or NaCl.

10. The method according to claim 1, wherein the second component comprises a substance that decreases the resistivity of the first component.

11. The method according to claim 1, wherein the second component is dissolved in the first component.

12. The method according to claim 11, wherein the second component comprises a substance that does not precipitate out of the first component.

13. The method of claim 1, wherein disposing the fluid between the workpiece and the lens system comprises providing the fluid from a fluid handler, wherein the fluid handler includes a reservoir for containing the second component and a premix chamber for mixing the second component with the first component.

14. The method of claim 1, wherein disposing the fluid between the workpiece and the lens system comprises providing the fluid from a fluid handler, containing a mixture of the first component and the second component.

15. The method of claim 1, wherein disposing the fluid between the workpiece and the lens system comprises providing the fluid from a fluid handler, an injection system for injecting the second component into the first component.

16. The method according to claim 1, further comprising dissolving the second component in the first component.

17. The method according to claim 1, further comprising:
placing the first component in a chamber; and
pressurizing the chamber while introducing the second component to the first component.

18. The method of claim 1 wherein:
the projection lens system is disposed proximate the wafer support and has a last element disposed at one end thereof;
the immersion head is disposed proximate the last element of the projection lens system, the immersion head comprising a plurality of ports for disposing the fluid between the last element of the projection lens system and the wafer support; and
the immersion exposure tool further includes a fluid handler adapted to provide the fluid.

19. The method according to claim 18, wherein the fluid handler is adapted to provide the fluid comprising the first component and the second component.

20. The method according to claim 19, wherein the fluid handler is adapted to provide a second component comprising $CO_2$, $O_2$, $N_2$, a nitrogen-containing substance, an oxygen-containing substance, $H_2O_2$, or NaCl.

21. The method according to claim 18, wherein the wafer support is moved with respect to the projection lens system during the exposing step and wherein the fluid is disposed between the last element of the projection lens system and the semiconductor workpiece during the exposing step.

22. The method according to claim 21, wherein an electrostatic energy potential is formed by the movement of the wafer support, and wherein the fluid discharges the electrostatic energy.

23. The method according to claim 1, wherein the immersion exposure tool further includes means for altering a resistivity of the fluid.

* * * * *